(12) United States Patent
Ning et al.

(10) Patent No.: US 9,329,471 B1
(45) Date of Patent: May 3, 2016

(54) ACHIEVING A CRITICAL DIMENSION TARGET BASED ON RESIST CHARACTERISTICS

(71) Applicant: GLOBALFOUNDRIES Inc., Grand Cayman (KY)

(72) Inventors: Guoxiang Ning, Ballston Lake, NY (US); Xintuo Dai, Clifton Park, NY (US); Huang Liu, Mechanicville, NY (US); Chin Teong Lim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 23 days.

(21) Appl. No.: 14/533,497

(22) Filed: Nov. 5, 2014

(51) Int. Cl.
*G03F 1/54* (2012.01)
*G03F 1/70* (2012.01)
*G03F 1/80* (2012.01)
*G03F 7/20* (2006.01)
*G06F 17/50* (2006.01)

(52) U.S. Cl.
CPC .. *G03F 1/70* (2013.01); *G03F 1/54* (2013.01); *G03F 1/80* (2013.01); *G03F 7/20* (2013.01); *G06F 17/5072* (2013.01); *G06F 17/5081* (2013.01)

(58) Field of Classification Search
CPC ............... G03F 1/54; G03F 1/70; G03F 1/80; G03F 7/20; G06F 17/5072; G06F 17/5081
USPC ........................ 430/5, 30, 320, 323
See application file for complete search history.

(56) References Cited

U.S. PATENT DOCUMENTS

| 6,200,726 B1 | 3/2001 | Chen et al. |
| 6,338,934 B1 | 1/2002 | Chen et al. |

*Primary Examiner* — Christopher Young
(74) *Attorney, Agent, or Firm* — Heslin Rothenberg Farley and Mesiti PC; Nicholas Mesiti

(57) ABSTRACT

Achieving a critical dimension target for a feature based on characteristics of a resist is facilitated. Mask data is established for fabricating a lithographic mask to expose different regions of a resist to high, low, and intermediate exposure levels. The resist is configured to exhibit high solubility when exposed to the high or low exposure level, and low solubility when exposed to the intermediate exposure level. A critical dimension for a region of the resist to be exposed to the intermediate exposure level is determined, and the mask data is established to indicate opaque regions for forming on the lithographic mask. The opaque regions are arrayed to facilitate exposing the region of the resist to the intermediate exposure level, to achieve the determined critical dimension. Further, a method is provided for forming in-situ a patterned mask from a mask layer above a substrate material.

16 Claims, 14 Drawing Sheets

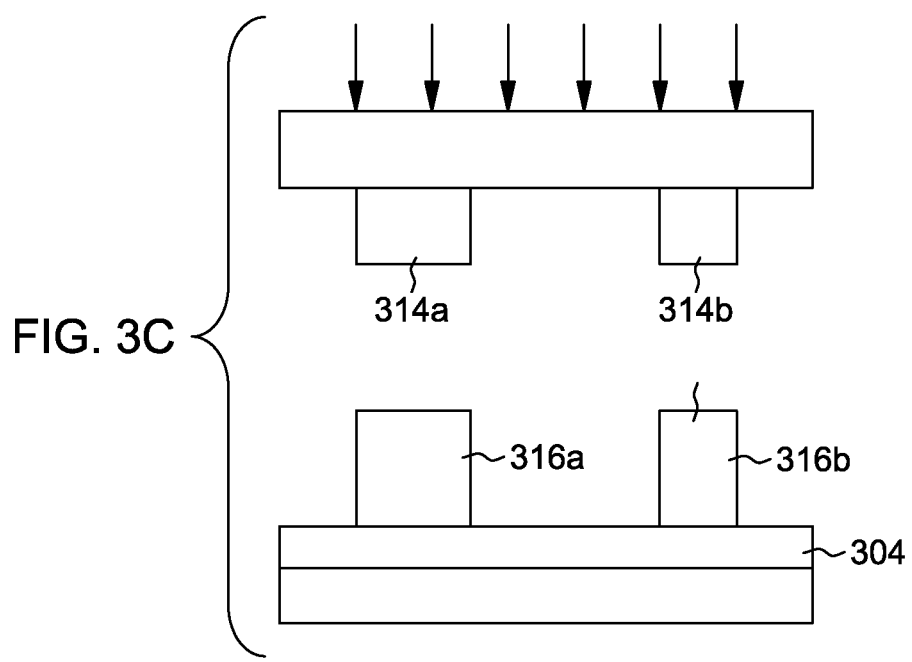

ACHIEVING A CRITICAL DIMENSION TARGET BASED ON RESIST CHARACTERISTICS

BACKGROUND

In circuit structure fabrication, there is a desire to continually increase densities of devices within a given chip area to achieve greater functionality and to reduce manufacturing costs. This desire for large scale integration has led to a continued shrinking of circuit dimensions and device features. The ability to reduce the size of such features is driven by performance enhancements in the lithographic processes by which integrated circuit structures are formed on a wafer. This process is also referred to as photolithography, or simply lithography. As is well known, lithographic processes can be used to transfer a pattern of a photomask to a wafer. Consequently, feature size, line width, and the separation between features and lines are becoming increasingly smaller. Yield is affected by factors such as mask pattern fidelity, optical proximity effects, and photoresist processing. However, existing processes can result in undesirable effects that often times must be countered by either changing the design specification (to increase critical dimension or pitch, as examples) or using additional material, such as additional hardmask layers to protect underlying layers.

BRIEF SUMMARY

The shortcomings of the prior art are overcome and additional advantages are provided through the provision of a method that includes establishing lithographic mask data for fabrication of a lithographic mask for exposing different regions of a resist to high, low, and intermediate exposure levels, the resist configured to exhibit high solubility to a developer when exposed to one or more of the high exposure level or the low exposure level, and exhibit low solubility to a developer when exposed to the intermediate exposure level. The establishing includes determining a critical dimension for a region of the resist to be exposed to the intermediate exposure level; and establishing lithographic mask data indicating a plurality of opaque regions for forming on the lithographic mask, the plurality of opaque regions being arrayed in at least one direction and configured to block, at least partially, light from passing through the lithographic mask, wherein the plurality of opaque regions being arrayed facilitates exposing the region of the resist to an intermediate exposure level to achieve the determined critical dimension for the region of the resist.

Additionally, a method is provided that includes forming in-situ a patterned mask from a mask layer above a substrate material. The forming includes obtaining a lithographic mask comprising a plurality of opaque regions arrayed in at least one direction; disposing a resist material above the mask layer, the resist material configured to exhibit high solubility to a developer when exposed to at least one of a high exposure level or a low exposure level, and exhibit low solubility to a developer when exposed to an intermediate exposure level; and performing an exposure of the resist using the obtained lithographic mask, wherein the arrayed plurality of opaque regions are configured to block, at least partially, light from passing through the lithographic mask, and wherein the plurality of opaque regions being arrayed facilitates exposing a region of the resist to an intermediate exposure level to achieve a determined critical dimension for the region of the resist, the region corresponding to critical dimension of an element of the patterned mask.

Additional features and advantages are realized through the concepts of the present invention. Other embodiments and aspects of the invention are described in detail herein and are considered a part of the claimed invention.

BRIEF DESCRIPTION OF THE DRAWINGS

Aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 3A-3C illustrate example positive and negative lithographic processes to etch a pattern into a resist above a substrate of a multi-layer structure;

DETAILED DESCRIPTION

Figure 1A:
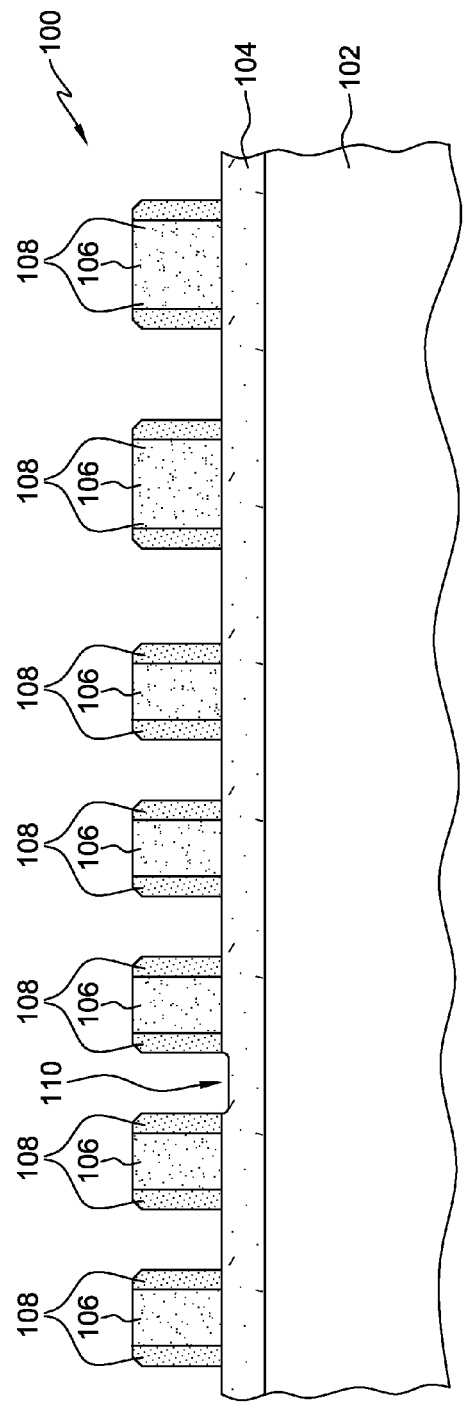
FIGS. 1A and 1B illustrate gouging that can occur in connection with spacer formation during the formation of fin structures.
Figure 1B:
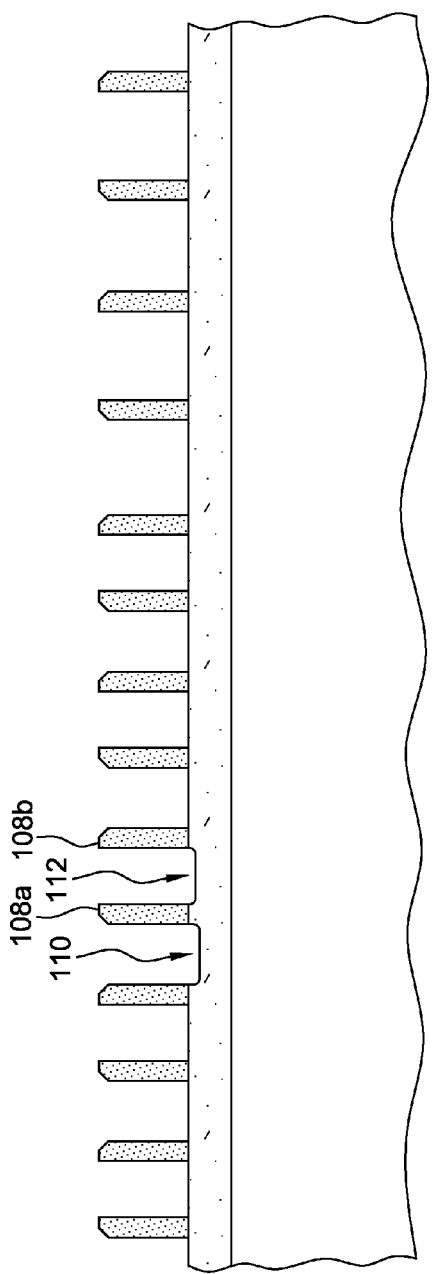

Described herein are methods for achieving a critical dimension target for a feature based on characteristics of a resist. Aspects described herein can also be leveraged to replace or refine existing processes for achieving relatively tight pitch and small critical dimension in, for instance, fin formation. One such existing process is a sidewall image transfer (multiple patterning) process involving spacers. FIGS. 1A and 1B illustrate gouging that can occur in connection with spacer formation during the formation of fin structures.

In FIG. 1A, structure 100 includes a substrate 102, such as a semiconductor substrate, for instance a silicon substrate, and a protective substrate hardmask layer 104. Protective substrate hardmask layer 104 may be a layer of hardmask material, such as silicon nitride (SiN) or titanium nitride (TiN), as examples. Protective substrate hardmask layer 104 is formed over a silicon substrate 102. Mandrels 106 have been formed from a layer of material such as amorphous silicon. After formation of the mandrels, a sidewall spacer layer is conformally provided over and between the mandrels 106 and the hardmask layer 104 using any conventional technique, such as chemical vapor deposition (CVD) or atomic layer deposition (ALD), as examples. Portions of the sidewall spacer layer on top of and between mandrels 106 are etched away by any appropriate non-selective etching process. This forms sidewall spacers 108 along the sidewalls of mandrel structures 106. The width of a sidewall spacer 108 corresponds to critical dimension of the fin to be formed in substrate 102. The width of the sidewall spacer will be translated to a corresponding element formed in the protective hardmask layer 104, which will serve as a mask for etching into the substrate material 102 to form the fin.

This non-selective etching to remove some of the sidewall spacer layer material to form the sidewall spacers can result in over-etching, i.e. downward through a thickness of the sidewall spacer layer between the mandrels 106. An example of this over-etching, termed "gouging", is indicated by 110 in FIG. 1A. Gouging in this case results in etching of a portion of the hardmask layer 104, and thereby disadvantageously results in protective substrate mask thickness variations.

The problems associated with these variations can become compounded when the amorphous silicon material of the mandrels 106 (i.e. between the sidewall spacers 108) is removed. Such removal is typically accomplished by way of selective etching. The selective etching etches the amorphous silicon material of each mandrel 106 between each pair of sidewall spacers 108 surrounding the respective mandrel, thereby creating a sidewall spacer pattern as depicted in FIG. 1B. However, height variations in the resultant mask pattern are seen across the protective substrate mask layer 104, as illustrated in FIG. 1B. For instance, over-etching of the amorphous silicon material between spacers 108a and 108b has resulted in gouge 112. Meanwhile, it is possible that gouge 110 has become deeper as a result of this second etch process to remove the amorphous silicon material. Thus, not only may gouging occur, but the degree of gouging may vary across the protective substrate mask layer 104. Moreover, gouging to at least some extent is practically inevitable. While FIGS. 1A and 1B depict only two gouges, it should be understood that gouging occurs across the protective substrate mask layer 104. Additionally or alternatively, under-etching may occur wherein the sidewall spacer layer or amorphous silicon layer are under-etched, resulting in a protrusion above the surface of the protective substrate mask layer 104.

In any case, lack of planarity or uniformity of the protective substrate mask layer 104 may cause undesirable variations in the resultant semiconductor structure, for instance, fin structures and/or gate structures, during subsequent fabrication processing using such a mask formed by the layer. Such variations are unavoidable effects of this processing when dealing with the tight pitch and critical dimensions of today's demands.

Figure 2A:
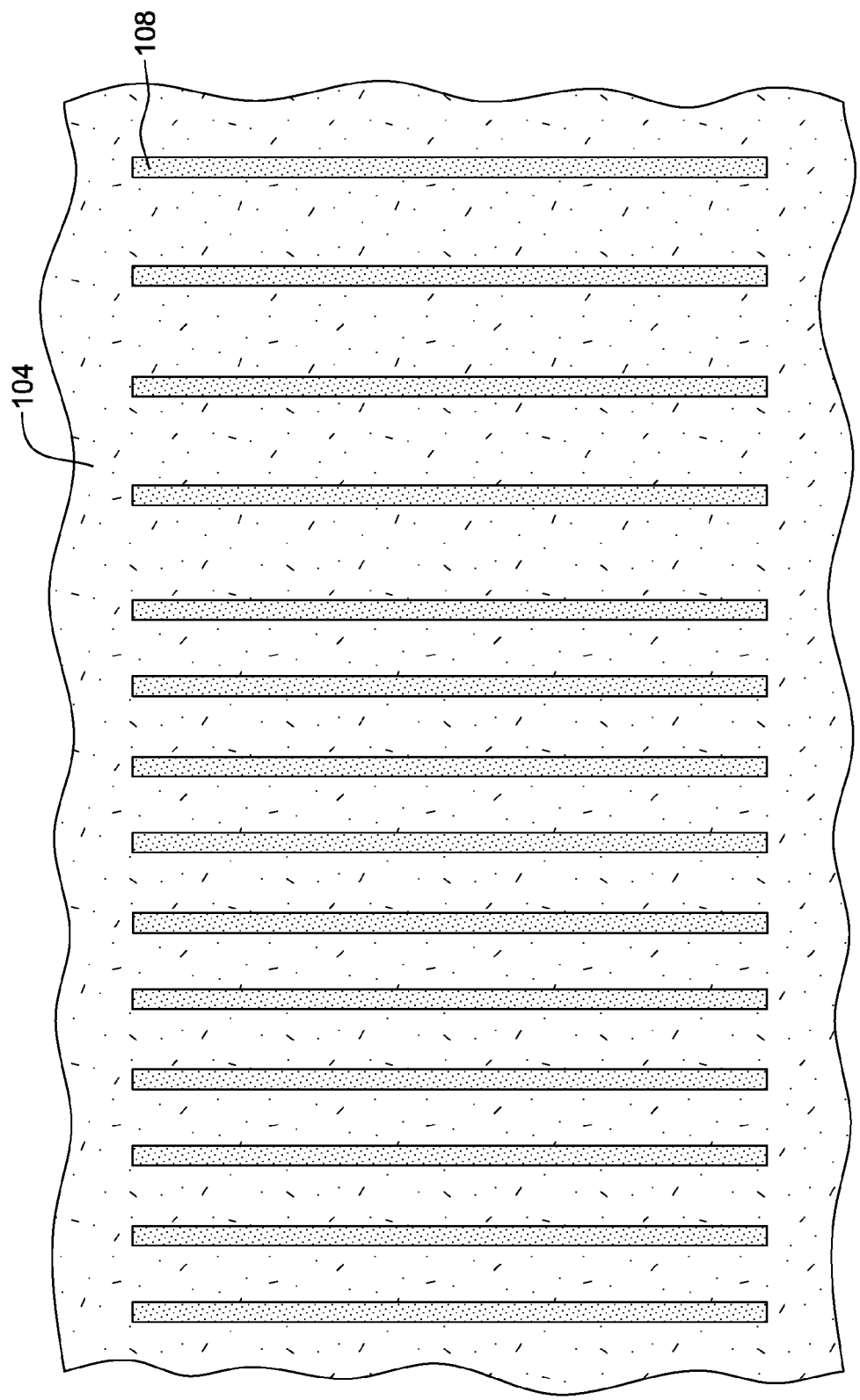
FIGS. 2A and 2B illustrate cuts made across spacers formed during intermediate process steps in the formation of fin structures.
Figure 2B:
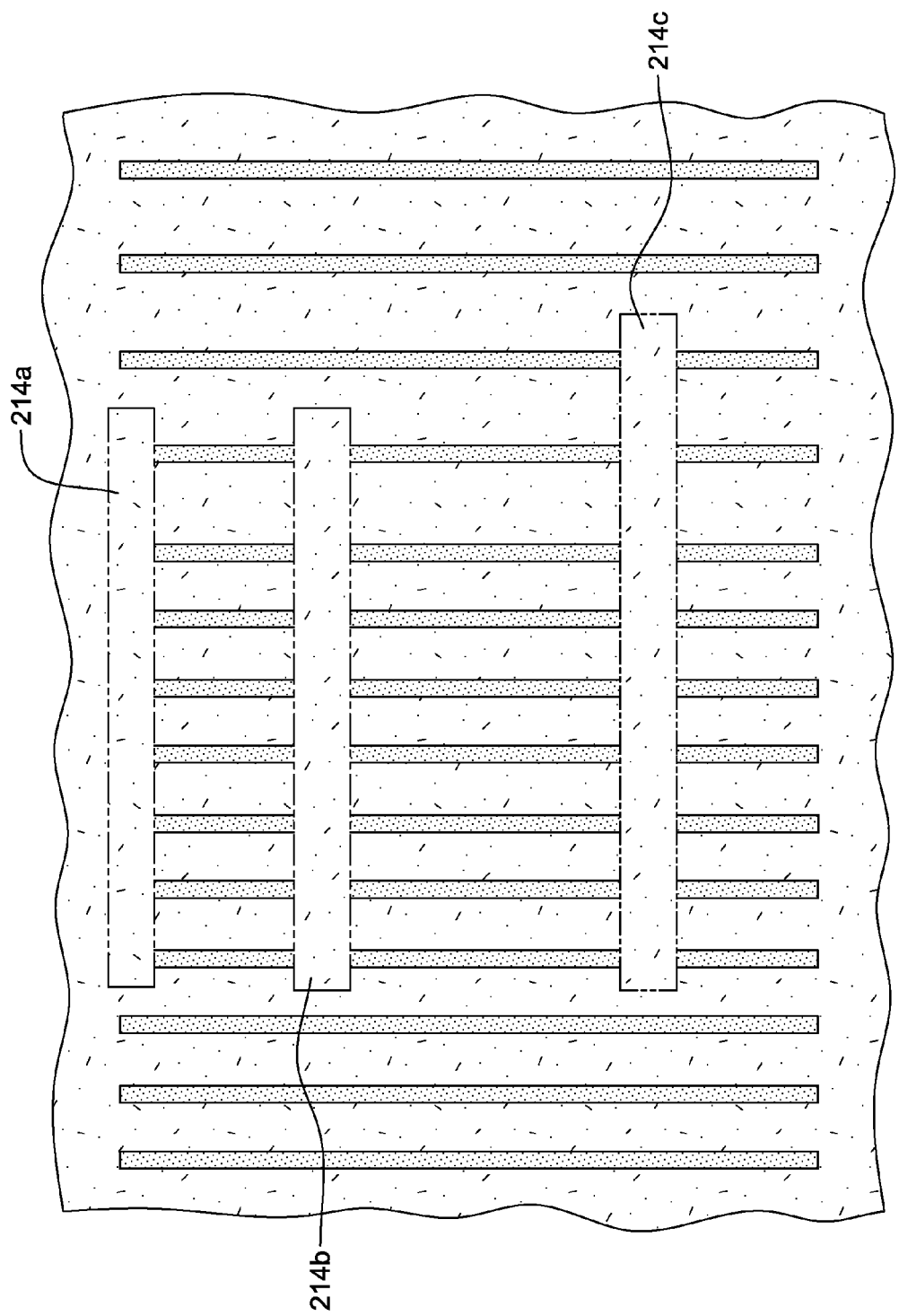

Further problems can result in the cut-formation process performed after sidewall spacers are formed. FIGS. 2A and 2B illustrate cuts made across spacers formed during intermediate process steps in the formation of fin structures.

FIG. 2A presents a top view of FIG. 1B, showing spacers 108 and protective substrate mask layer 104. FIG. 2B shows where cuts 214a, 214b, and 214c are to be made across the spacers. The cuts will be etched down through the protective substrate mask layer 104 to (ideally) the top of substrate 102. Additionally, other areas may be covered by a resist material and another etch may be performed to etch through uncovered areas of the protective substrate mask layer 104.

To produce the final hardmask incorporating fin positioning, sizing, and cuts across the fins as described above, three or more masks are used. This is complex, time consuming, and costly. Furthermore, this cut process can result in well-known ad undesirable effects such as corner rounding and/or line edge roughness, especially at relatively small critical dimensions and pitches.

Aspects described herein enable decreasing critical dimension and increasing resolution of the features being patterned on a photoresist. The photoresist may be used to pastern a hardmask to etch an underlying substrate, and the spacer process above may be avoided.

Figure 3A:
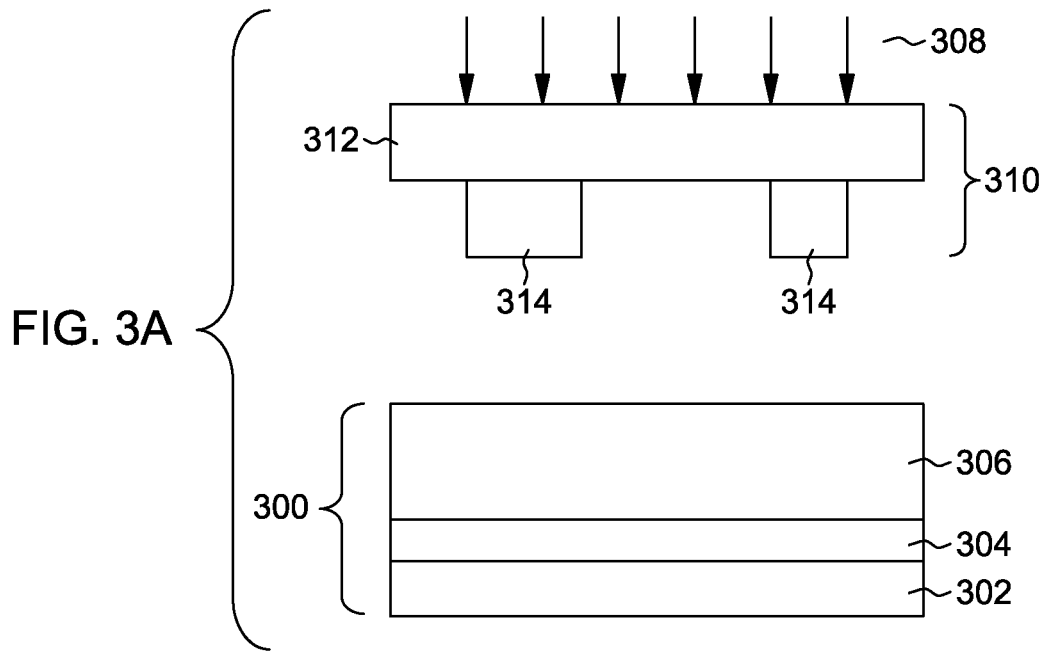
Figure 3B:
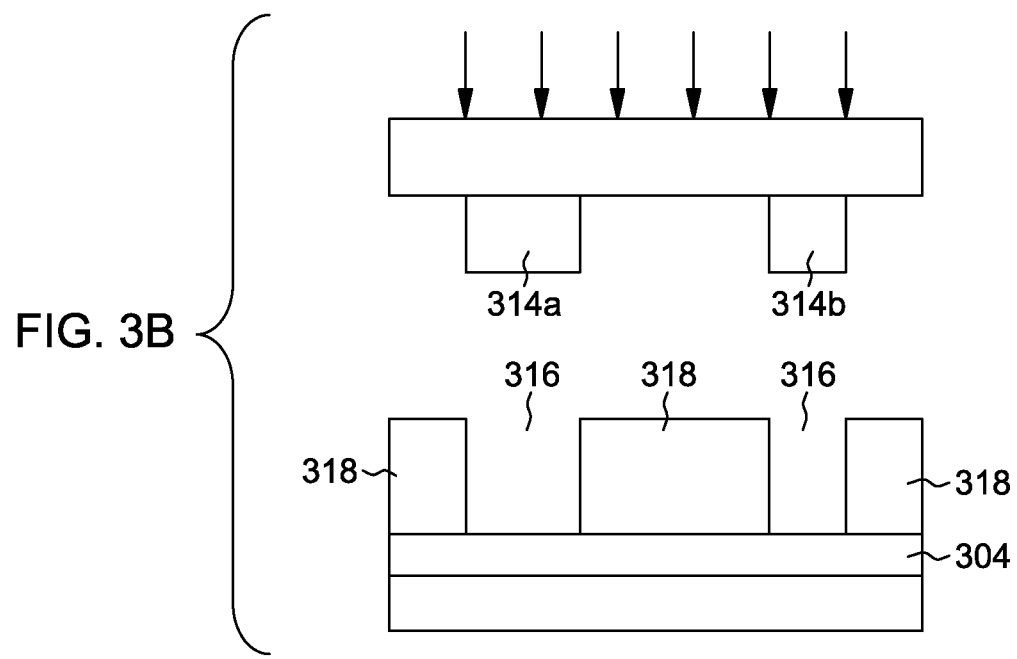

FIGS. 3A-3C illustrate example positive and negative lithographic processes to etch a pattern into a resist above a substrate of a multi-layer structure.

FIG. 3A depicts a multi layer structure 300 including a substrate layer 302, hardmask layer 304, and photoresist ("resist") layer 306. Radiation, such as electromagnetic radiation ("light") or other forms of radiation 308 impinges on a mask 310. Mask 310 is a binary mask in this example, and includes a transparent or translucent substrate 312 (e.g., glass or quartz) and opaque or pattern regions 314 (which may be formed from chromium or chromium oxide, as examples) thereon. Opaque regions 314 provide a pattern or image associated with a desired pattern, features, or devices to be projected onto photoresist layer 306.

As light passes to mask 310, light incident upon the translucent areas of the mask will pass through the mask, while light incident on the opaque areas will be blocked. Light passing through the mask exposes portions of the photoresist layer 306 of the multi-layer structure 300.

An example resist type is a "positive resist". A positive resist is one that, initially unexposed, is practically insoluble in developer, but becomes soluble when it is exposed to radiation, such as light, above a threshold value. A "negative resist" is one that, initially unexposed, is soluble in developer, but becomes insoluble when it is exposed to radiation.

FIG. 3B depicts the case where resist 306 (FIG. 3A) is a negative resist, and an exposure and development of the resist has been performed. Opaque regions 314a and 314b will block light from exposing the portions of the resist underneath the opaque regions, while the other regions of the resist will be exposed. When developed, the regions of resist blocked from the exposure will be removed. Regions 318a and 318b depict the regions where resist material is removed. The areas of the resist exposed to light, will remain insoluble to the developer and therefore will not be removed by the development process. These regions of the resist, identified as 318 in FIG. 3B, form a pattern in the resist layer 306 that may be transferred down to an underlying layer, such as the hardmask layer 304.

FIG. 3C depicts the case where resist 306 (FIG. 3A) is a positive resist, and an exposure and development of the resist has been performed. As before, opaque regions 314a and 314b will block light from exposing the portions of the resist underneath the opaque regions, while the other regions of the resist will be exposed. The exposure of these other regions will render the exposed portions of the resist soluble to the developer. When developed, the regions of resist blocked from the exposure, 316a and 316b, will remain intact. Regions 316a and 316b form a pattern in the resist layer 306 that may be transferred down to an underlying layer, such as the hardmask layer 304.

The positive and negative resists described above are sometimes referred to as positive tone or negative tone resists. Dual-tone resists (or "hybrid" resists) are also possible, for instance those described in U.S. Pat. No. 6,200,726, entitled "OPTIMIZATION OF SPACE WIDTH FOR HYBRID PHOTORESIST", and U.S. Pat. No. 6,338,934, entitled "HYBRID RESIST BASED ON PHOTO ACID/PHOTO BASE BLENDING", which are hereby incorporated herein by reference in their entirety.

Aspects described herein leverage characteristics of dual-tone resists. Like single-tone resists, dual-tone resists exhibit different resistance (to a developer) at differing exposure intensities. Unlike a single-tone resist that has a single threshold intensity level at which it transitions between soluble and insoluble to a developer, a dual-tone resist has three distinct intensity ranges in which it is either soluble or insoluble. Thus, the resist may be insoluble when exposed to either of a high dose intensity or a low dose intensity, but may be soluble when exposed to some intermediary level of intensity. Conversely, the dual-tone resist may be soluble when exposed to either of a high dose intensity or a low dose intensity, but may be insoluble when exposed to some intermediary level of intensity.

When an opaque region of a mask blocks light from passing through the mask to the resist, a shadow is cast onto an area of the resist. Consequently, a profile of the dose intensity being delivered to the resist at the edge of the shadow transitions from a high intensity to a low intensity. This profile is a continuous transition between a relatively high dose intensity and a relatively low dose intensity, and is caused by diffraction effects around the edges of the opaque region. The transition spans some distance across the resist; it is not an immediate transition. The chemical properties of the dual-tone resist will dictate the exposure intensities at which the resist transitions from soluble to insoluble, or vice versa.

With one type of dual-tone resist, areas exposed to an exposure intensity above some threshold intensity will be removable when developed, and areas exposed to an exposure intensity below some other threshold intensity will be removable when developed. Areas exposed to exposure intensities between these two thresholds will remain intact when developed. With another type of dual-tone resist, the areas at which the exposure intensity is above some threshold intensity will remain intact when developed, as will the areas at which the exposure intensity is below some other threshold intensity, but areas between these two thresholds will be removable. The dual-tone resist can be configured so that these threshold intensities are tailored to different values, effectively shrinking or enlarging this intermediate range of intensities.

A dual-tone resist can be incorporated into lithographic processes for forming structures such as fin-FETs ("fin" herein). In fin formation processes, as described above, several thin parallel lines may be formed in a resist layer on top of a hardmask layer. The lines may be used in different ways. For instance, they may serve as mandrels, in which a conformal layer is formed over and between the mandrels, then the conformal layer material between the mandrels is removed, along with the resist material, leaving sidewall spacers. As another example, if the lines formed in the dual-tone resist are of small enough critical dimension, the resist pattern is itself is used in an etch or other material removal process, in which the resist pattern is transferred to the hardmask layer, to pattern the hardmask. Thus, a single reticle (mask) may be used in conjunction with a dual-tone resist to form a pattern in the resist material. This patterning of the resist that will pattern the hardmask immediately above the silicon substrate is accomplished with a single exposure, and the fins may be formed using only a single hardmask, providing significant advantages over existing practices.

Figure 4A:
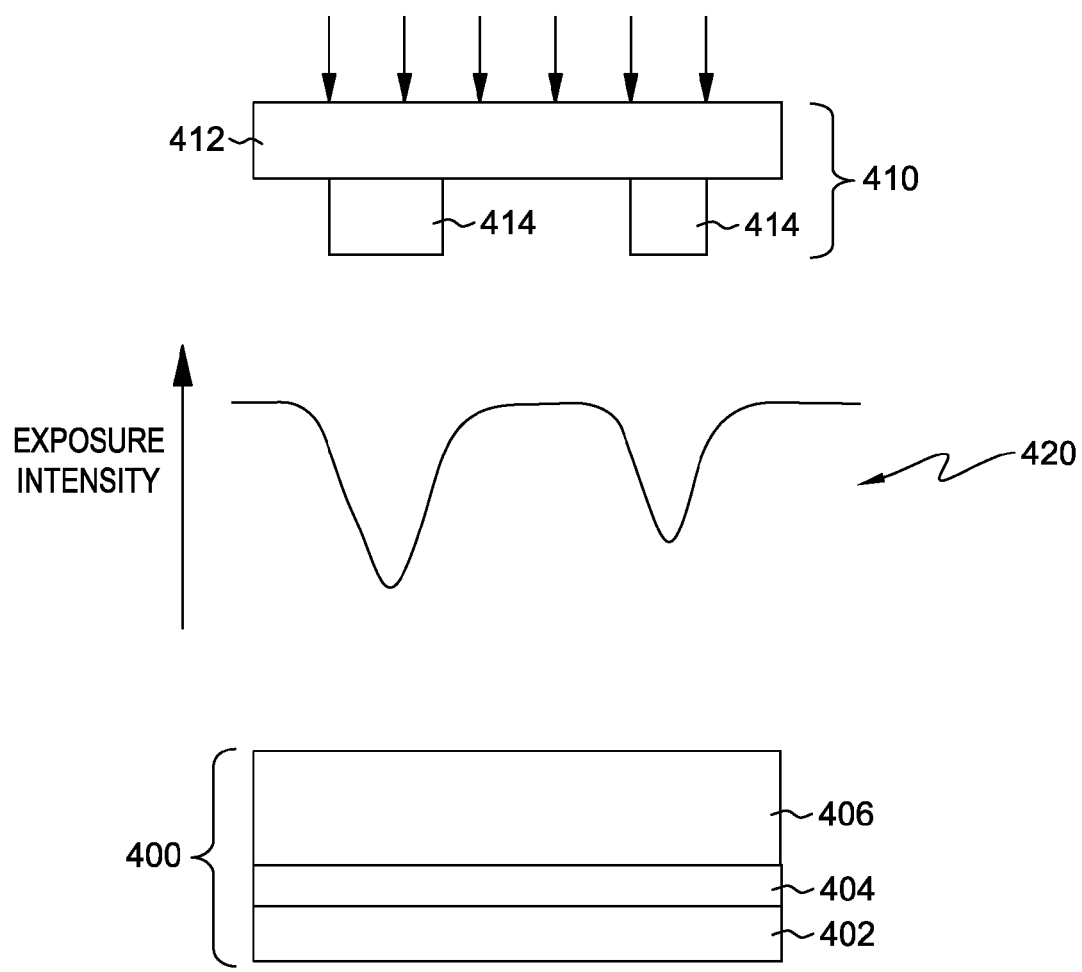
FIGS. 4A-4C illustrate an example process to etch a pattern into a dual-tone resist above a substrate of a multi-layer structure.
Figure 4B:
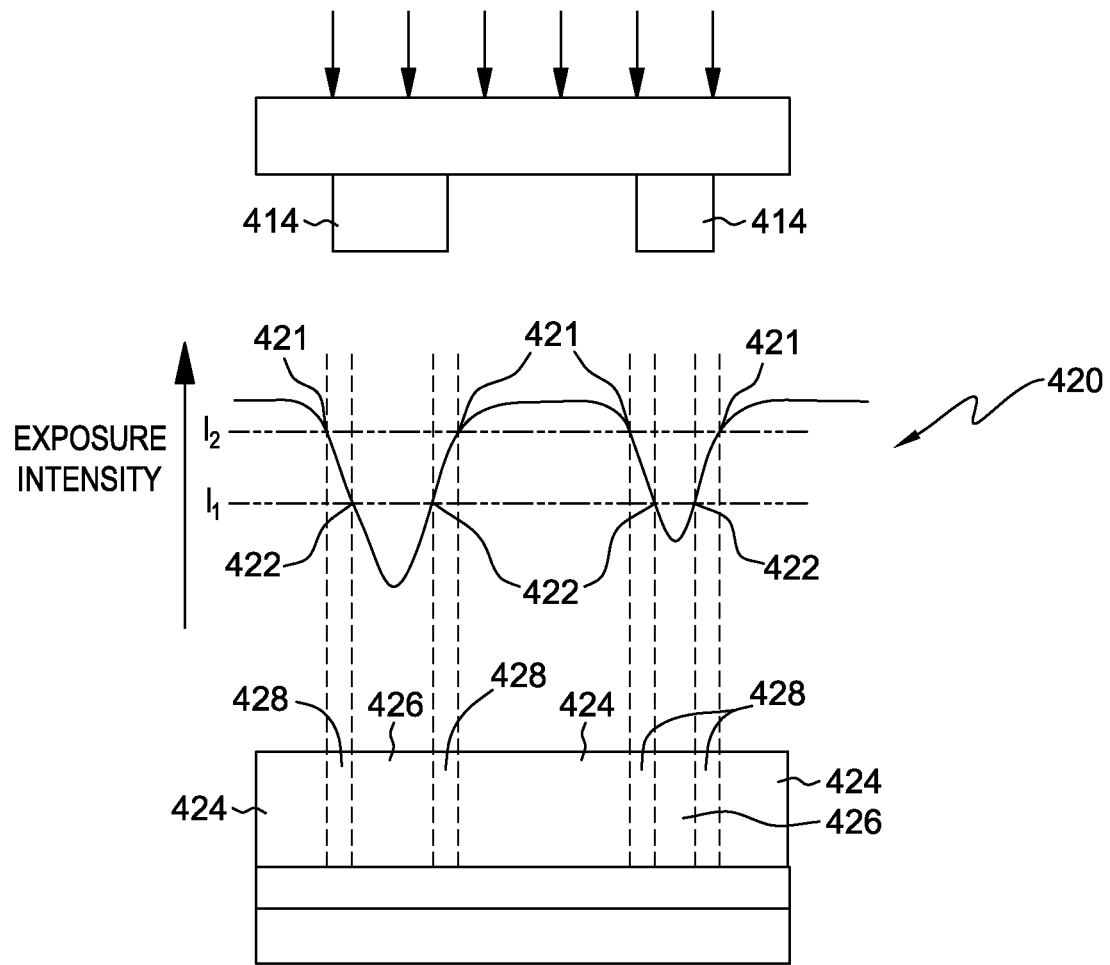
Figure 4C:
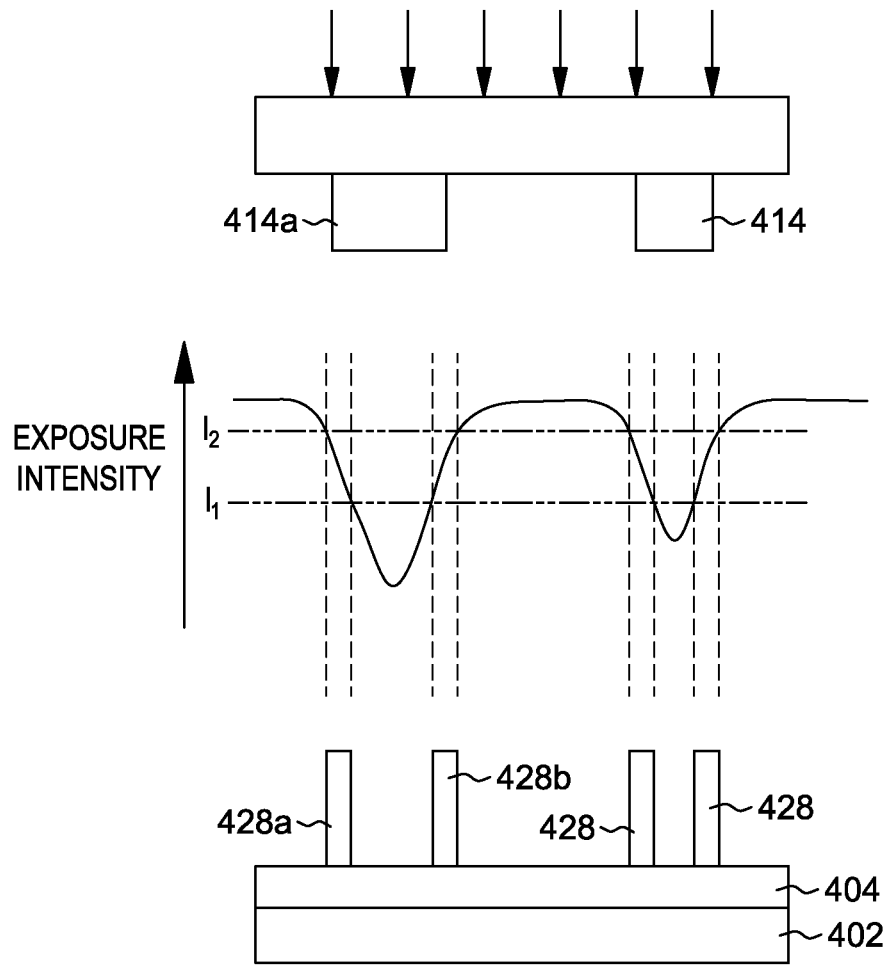

FIGS. 4A and 4C illustrate an example process to etch a pattern into a dual-tone resist above a substrate of a multi-layer structure. A mask 410 including translucent portion 412 and opaque portions 414 is used in an exposure of the multi-layer structure 400. The multi-layer structure includes an underlying substrate, for instance a silicon substrate, with a hardmask layer 404 disposed thereon. A dual-tone resist 406 is disposed on top of the hardmask layer 404.

When an exposure is performed, the opaque regions 414 block, at least partially, light from reaching areas of the resist 406, causing variation in the exposure intensity delivered to different areas of the resist. FIG. 4A depicts an exposure intensity plot 420 showing exposure intensity variation in a single direction across the mask. The exposure intensity plot 420 illustrates the effect of the opaque regions 414 on the intensity of exposure of the resist 406 below these opaque regions, i.e. exposure intensity sharply decreases directly underneath the opaque regions. In general, the opaque regions block light from passing through the mask, but the exposure intensity profile 420 is not a binary (square) wave because of diffraction and reflection effects near and around the edges of the opaque regions. The result is a continuous exposure intensity plot with defined (i.e. not infinite) slopes.

FIG. 4B shows the effect that the exposure intensity plot 420 has on the exposure levels delivered to the resist 406. Exposure intensities $I_1$ and $I_2$ define an intermediate exposure intensity level, which includes all exposure intensity values between $I_1$ and $I_2$ inclusive. Within this intermediate exposure level, the resist is configured to behave differently than when exposed to radiation intensities greater or lesser than those within that intermediate exposure level. $I_1$ and $I_2$, referred to herein as threshold intensities, are defined by the characteristics of the resist, for instance the materials used in its formulation. As used herein, exposure intensity levels that are greater than the intermediate exposure level are referred to as a high exposure level, and exposure intensity levels that are lesser than the intermediate exposure level are referred to as a low exposure level.

$I_2$ denotes the upper threshold intensity, i.e. the upper bound on the intermediate region, while $I_1$ denotes the lower threshold intensity, i.e. the lower bound on the intermediate region. Points 421 and 422 denote points along the exposure intensity plot 420 at which the exposure intensity delivered to the resist transitions into or out of the intermediate exposure level. Dashed lines in FIG. 4B project the positioning of those transitions down to the resist layer 406, and define regions of the resist that are exposed to the intermediate exposure level, high exposure level, and low exposure level. Specifically, regions 424 are exposed to a high exposure level, regions 426 are exposed to a low exposure level, and regions 428 are exposed to the intermediate exposure level.

As described above, the dual-tone resist is configured to exhibit the same relative level of solubility (either high or low) at the high and low exposure levels, and exhibit an opposite level of solubility at the intermediate level. Referring to FIG. 4C, in this example, regions of the resist exposed to high or low exposure levels are relatively highly soluble, while regions exposed to the intermediate exposure level are relatively insoluble. In one example, the dual-tone resist when unexposed may be relatively highly soluble, and the resist is configured to become highly insoluble in regions exposed to intensity levels within the intermediate exposure level. Alternatively, the resist may initially be highly insoluble initially (unexposed), and exposure at the high or low exposure level causes the resist to become highly soluble.

In FIG. 4C, the soluble portions of the resist have been removed, leaving regions 428 intact. These regions (or "features") leave a pattern of resist material over hardmask layer 404. The pattern can be transferred to the hardmask layer 404 using known methods of removing the hardmask layer material except for hardmask material directly beneath the overlying resist regions. The resist may then be removed and the patterned hardmask remains for patterning structures, such as fin lines, into the substrate layer.

Width (critical dimension) of the resist feature 428 is dictated by the threshold intensity levels $I_1$ and $I_2$, together with the slope of the exposure intensity plot between intensities $I_1$ and $I_2$. A transition in exposure intensity between $I_1$ and $I_2$ across a shorter distance (i.e. a greater absolute value of the exposure intensity slope) will produce thinner features in the resist. A more gentle slope of the exposure intensity plot will yield a wider resist feature. Additionally related to this is positioning of the resist features relative to the edges of the opaque regions of the lithographic mask. It may or may not be the case that the resist features formed by the opaque region are completely covered by the opaque region, e.g. an outer edge of a resist feature aligns with an edge of an opaque region. In some examples, a resist feature may be centered directly below the edge of an opaque region, or it may be formed to the left or right (with respect to depictions herein) of centered.

Consequently, the critical dimension of the resist features is directly related to the characteristics of the dual-tone resist affecting the threshold intensities of the resist, as well as parameters of the lithographic system and exposure setup. Different characteristics of the dual-tone resist can change the intermediate intensities. The characteristics of the dual-tone resist can be adjusted so that the difference between threshold intensities is smaller or greater. Additionally or alternatively, characteristics of the lithographic system or setup thereof can be adjusted to adjust the slope of the intensity curve. As examples, the intensity of the radiation produced by the lithographic system and introduced to the mask, or a focal distance (distance between the lithographic mask and the surface of the resist), may be adjusted to adjust the critical dimension of the resist features.

Critical dimension of resist features formed as described herein may be sufficiently small to be useful in fin processing applications. In conventional spacer formation, the spacer material may be much more difficult to work with than resist material. Usage of a dual-tone resist as described herein sees the resist characteristics and lithographic system setup defining the critical dimension of features, e.g. fins, being formed. Smaller critical dimension than currently possible is achieved. Additionally, this may be achieved using only a single lithographic exposure. This can be especially useful in eliminating the need for various protective layers that were typically required in conventional feature formation. In some conventional processes, formation of features in a substrate material necessitates applying several—perhaps 7 or 8—layers on top of the substrate. Example layers include a nitride hardmask layer, a middle temperature oxide (MTO) hardmask layer over the nitride hardmask layer (used to control gouging), an amorphous silicon hardmask layer, a spin-on hardmask (SOH) planarization layer, a SiON hardmask layer, a bottom antireflective coating (BARC) layer, and/or a photoresist layer from which the lithographic process begins. Aspects described herein enable a manufacturer to eliminate the need for several of those layers. In some cases, only a single resist layer and single hardmask layer are needed over the substrate material to properly pattern the desired substrate features. Savings in terms of cost, time, resource usage, quality control, and so forth, is significant.

As described above, the positioning of the resist features formed in the dual-tone resist with respect to the edge of the opaque regions can vary according to, e.g. characteristics of the resist being used and possibly other factors like focal length and/or source light intensity. Consequently, generation of the lithographic mask data for fabricating the appropriate lithographic mask is not as straight forward as simply measuring the distances between the features of the resist target. The edges of lithographic mask features, such as the opaque regions, may not align with the edges of the actual resist features produced using that mask. This is illustrated in FIG. 4C, in which the resist features 428 formed are roughly on-center with respect to the side edges of the lithographic mask opaque regions 414.

Accordingly, described herein are methods for generating lithographic mask data based on targeted specifications (sizing, positioning, etc) for the resist features to be formed. In the examples described herein, the targeted specifications for the resist features are dictated by the target specifications of features to form in the hardmask layer, which are themselves dictated by the target specifications for the features to be formed in the underlying substrate layer. The lithographic mask data contains the specification for a lithographic mask, and the lithographic mask is fabricated based on the lithographic mask data.

Described herein are two approaches for generating lithographic mask data. These two approaches are described with respect fin formation by way of example, though the approaches can be applied in the formation of any desired features. Fin formation involves the formation of relatively thin lines in the resist. In line formation, particular attention may be given to a single dimension—the length of the line—where the goal for the second dimension (width of the line) is usually to minimize its critical dimension. However, aspects described herein can be applied to the formation of any desired features, for instance ones in which multiple dimensions (such as length and width) and/or shapes are of primary concern.

More specifically, the approaches are directed to the formation of parallel lines in a dual-tone resist material for patterning a hardmask, then subsequently a substrate, with parallel lines corresponding to the lines formed in the resist.

In a first approach, a resist target specification, such as critical dimensions and positioning for the lines to form in the resist, is obtained. Initial lithographic mask data is then determined, in which the opaque regions of the lithographic mask are determined to be sized and positioned corresponding to the areas between the lines to form in the resist. Then, an adjustment is made to the initial lithographic mask data (e.g. the specification of the opaque regions for the lithographic mask) to obtain modified mask data. The adjustment being made will be based on what effect the parameters of the dual-tone resist and/or the exposure being performed by the lithographic system (focal length, source light intensity as examples) has on the sizing and/or positioning of resist features resulting from an exposure using that lithographic mask. As an example, if these parameters cause adjacent features formed by a common opaque region to be positioned closer to each other, then the width of the opaque region as specified in the initial lithographic mask data should be increased. This will result in an increase in the distance between the regions exposed to the intermediate exposure level when the exposure is performed with the lithographic mask. By way of example, and referring to FIG. 4C, widening opaque region 414*a* increases distance between the side edges of opaque region 414*a*, causing features 428*a* and 428*b* to be patterned farther apart. Accordingly, in this example, the initial lithographic mask data can be modified to reflect an increased width of that opaque region, formed as region 414*a* when the lithographic mask is fabricated. By way of specific example, if the parameters of the resist and the exposure are such that the resist feature formed under a side edge of an opaque region is centered directly beneath the edge of the opaque region, then the initial lithographic mask data will be modified to widen the opaque region by shifting the edge of the opaque region by an amount equal to one-half of the critical dimension of the resist feature. This will also be done at the opposite side edge of the opaque region 414*a*. The opaque region 414*a* will effectively be widened by an amount equal to the critical dimension of one resist feature.

In a second approach, the resist target specification is first obtained, as in the first approach, but an adjustment is then made to the resist target specification. The adjustment will again be based on what effect the parameters of the dual-tone resist and/or the exposure being performed by the lithographic system (focal length, source light intensity as examples) have on the sizing and/or positioning of resist features resulting from an exposure using that lithographic mask. It is the same effect on the sizing/positioning of the resist features as above, the difference being that the effect is accounted for by adjusting the resist target specification, rather than the initial lithographic mask data. Using the example above in which the resist feature printed under a side edge of an opaque region is centered under that edge, the resist target specification can be modified to shrink the resist feature by one-half the width of the resist feature, making the resist feature half as narrow as it initially was. The lithographic mask data can then be generated from that modified resist target specification, in which the sizing and positioning of the opaque region is dictated by the edges of the resist feature as specified in the (modified) resist target specification. The shift in the edge of the resist feature in the resist target specification results in a partial overlap, by the opaque region, of the printed resist feature. That is, a part (i.e. half) of the resist feature is covered by the opaque region but the other half of the resist feature is not.

Both approaches will yield the same lithographic mask data, the difference being that in the generation of the mask data, either the lithographic mask data is modified (approach 1) or the resist target specification is modified (approach 2).

Thus in one approach, lithographic mask data is established for a lithographic mask for use in the performing the lithographic exposure of the resist. Establishing the lithographic mask data includes obtaining a critical dimension target for a pattern of multiple lines to pattern a hardmask. Based on the obtained critical dimension target, initial mask data is determined. The initial mask data indicates translucent or opaque regions to form on the lithographic mask, where those translucent or opaque regions correspond the multiple lines to be exposed to an intermediate exposure level when performing the lithographic exposure of the resist. After determining the initial mask data, the initial mask data is modified to obtain modified mask data. The modification includes resizing the translucent or opaque regions in the initial mask data based on characteristic(s) of the resist and/or the lithographic system. The modified mask data may then be used in the fabrication of a proper lithographic mask to use to form the resist features having the critical dimension target.

Further enhancements are now described in which configuration and sizing of opaque regions of a lithographic mask are varied to produce desired resist patterns. These examples are described and depicted with reference to FIGS. 5A-5C.

Figure 5A:
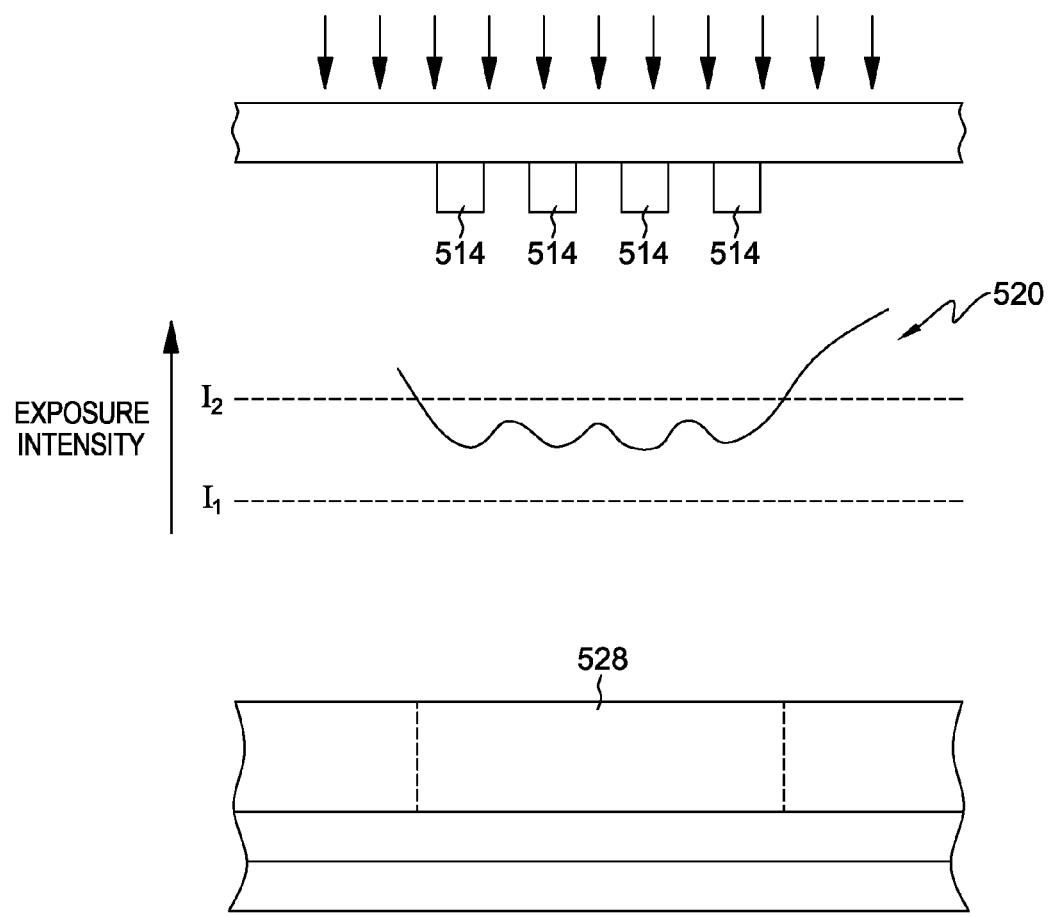
FIG. 5A-5C depict further examples of feature patterning in a dual-tone resist, in accordance with aspects described herein.

FIG. 5A demonstrates how an array of smaller opaque regions can be tailored to create a single, larger resist feature. Opaque regions 514 are spaced apart at a distance that will cause the exposure intensity 520 across the array to remain in the intermediate exposure region. This is because of the gaps between the opaque regions, which allow some light to pass through the array, resulting in fluctuations in the exposure intensity but maintaining it so that it does not fall below $I_1$. In this regard, it is noted that if a single opaque region were used that were the size (approximately) of the resist feature 528, then the exposure intensity would have fallen below $I_1$, which would have produced in two smaller resist features instead of a single, larger resist feature.

The resulting resist feature 528 is either a single large insoluble resist region (if the areas exposed to the intermediate exposure level remain intact after development), or a large void in the resist (if the areas exposed to the intermediate exposure level are removed after development).

Figure 6A:
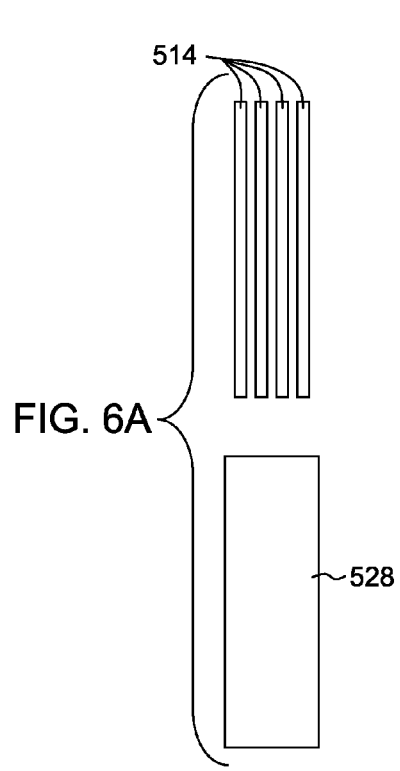
FIGS. 6A-6D depict lithographic mask patterns for forming on a lithographic mask, correlated to resulting resist patterns formed in a dual-tone resist when exposed using these mask patterns, in accordance with aspects described herein.

FIG. 6A depicts a top view of the opaque regions 514 in isolation, and correlates this to the resulting top view of the resist pattern 528 formed in the resist when exposed using a mask having that opaque region pattern. It is understood that dimensions of pattern 528 are directly related to the length of each line 514 and the number of arrayed elements 514 there are. Therefore, the dimension of pattern 528 can be adjusted by adjusting properties of the elements 514 (such length or width of elements 514, spacing of elements 514, number of elements 514, etc.).

Figure 5B:
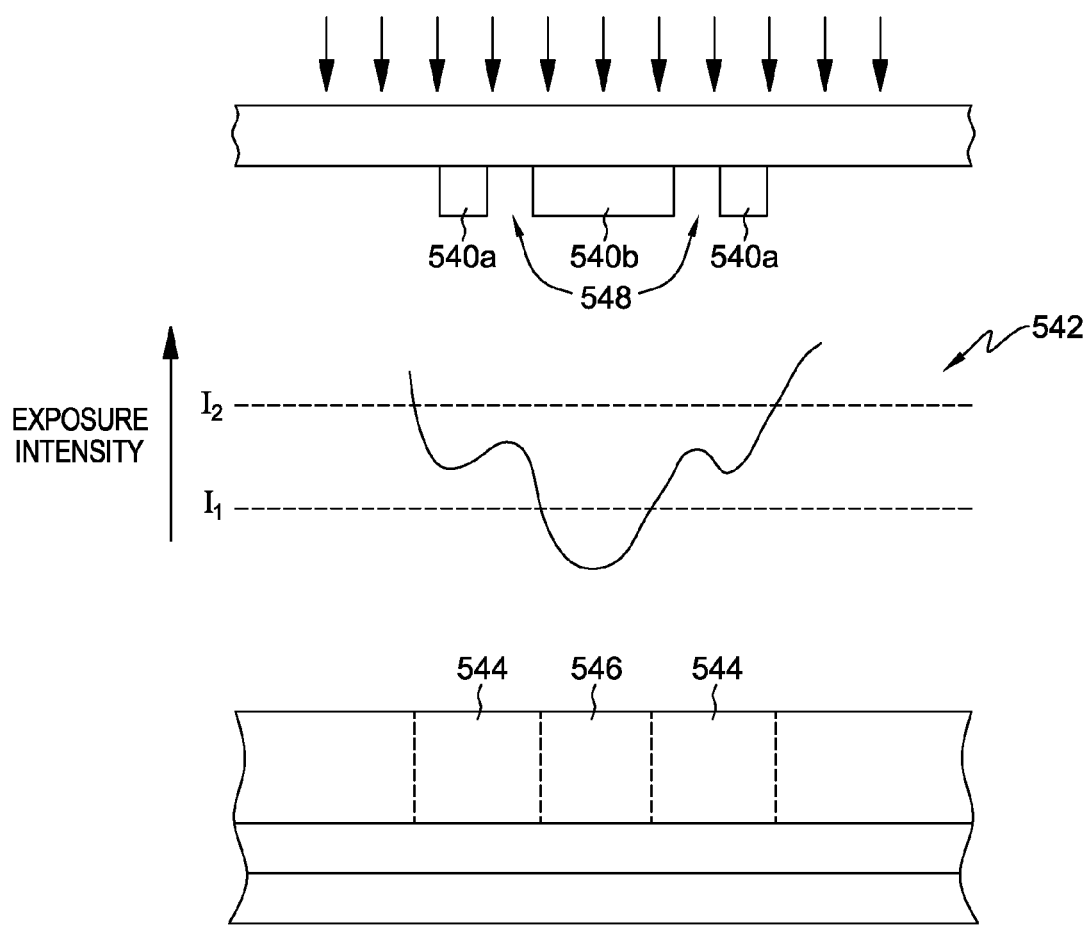

FIG. 5B demonstrates the effect of enlarging an opaque region disposed between other opaque regions. In this example, opaque region 540b is sized wider than regions 540a. The result is that region 540b blocks enough light to cause the exposure intensity 542 to dip below $I_1$. This results in two features 544 being printed, having an opposite feature 546 disposed between them.

It is noted that gaps 548 between the opaque regions serve the purpose of allowing some light to pass through the binary mask, causing the exposure intensity to hover in the intermediate exposure level across a greater lateral distance than it otherwise would have (e.g. if regions 540a and region 540b were a single continuous opaque region). The effect is that the resist features 544 are wider than they otherwise would be (e.g. if regions 540a and region 540b were a single continuous opaque region). Gap size, as well as opaque region size, can affect the sizing and positioning of the resist features being formed.

Figure 6B:
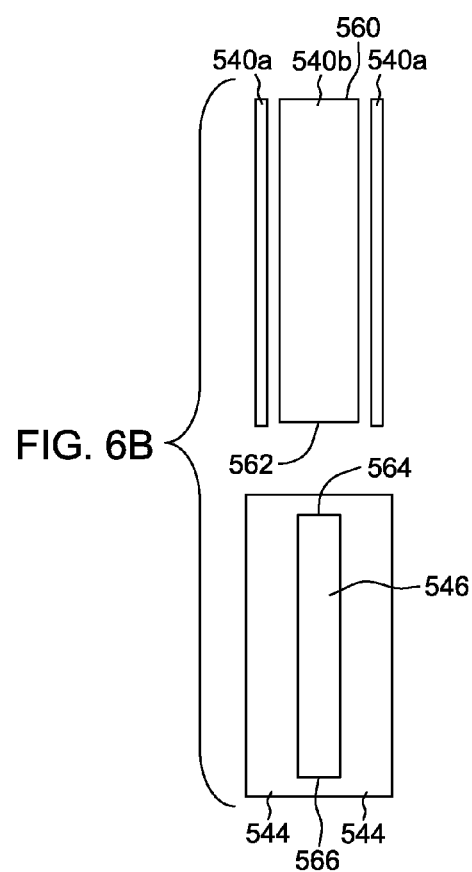

FIG. 6B depicts a top view of the opaque regions 540a and 540b in isolation, and correlates this to the resulting resist pattern 544, 546 formed in the resist when exposed using a mask having that opaque region pattern.

Figure 5C:
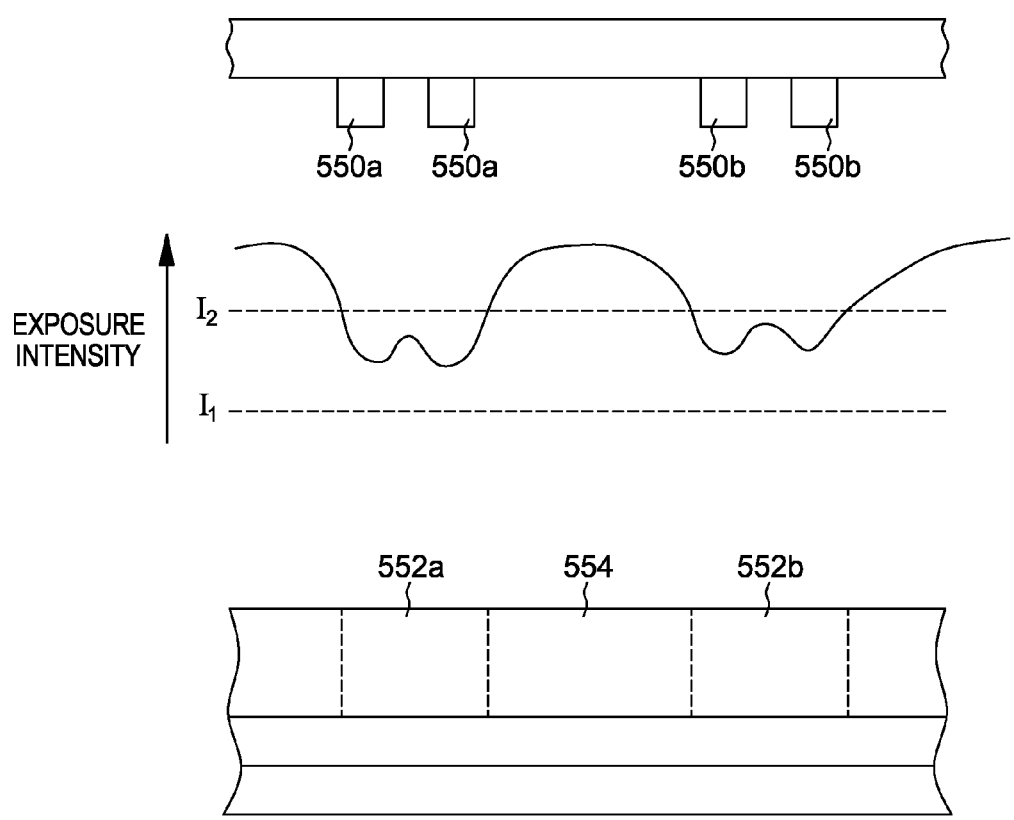
Figure 6C:
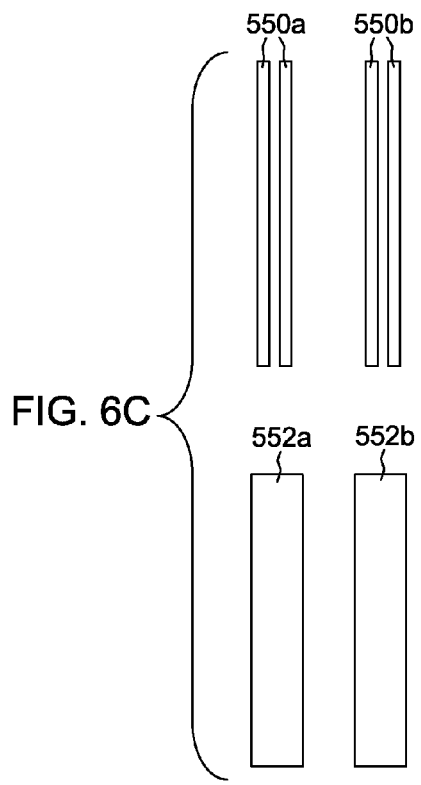

FIG. 5C demonstrates a scenario where an array of opaque regions (550a) form a single resist feature (552a), and the array can be repeated (as regions 550b) to form another, identical resist feature (550b), thereby forming a pattern of resist features (550a and 550b collectively) with opposite feature 554 between them. FIG. 6C depicts a top view of the opaque regions 550a and 550b in isolation, and correlates this to the resulting resist pattern 552, 554 formed in the resist when exposed using a mask having that opaque region pattern.

It is noted that FIGS. 6B and 6C both illustrate formation of parallel lines separated by a gap, with a difference being that the gap 546 of FIG. 6B is formed based by the presence and width of mask element 540b, while the gap of FIG. 6C is formed by the non-presence of a mask element, e.g. the spacing between 550a and 550b. In FIG. 6B, however, the parallel lines 544 are bridged at their tops and bottoms by resist material 564 and 566. These bridges are formed as a result of edges 560 and 562, respectively, of mask element 540b. That is, the intensity profile of light shining on/around edges 560 and 562 will exhibit a transition through the intermediate exposure region. The result is that portions 564, 566 of the resist material remain after exposure and development of the resist material.

Figure 6D:
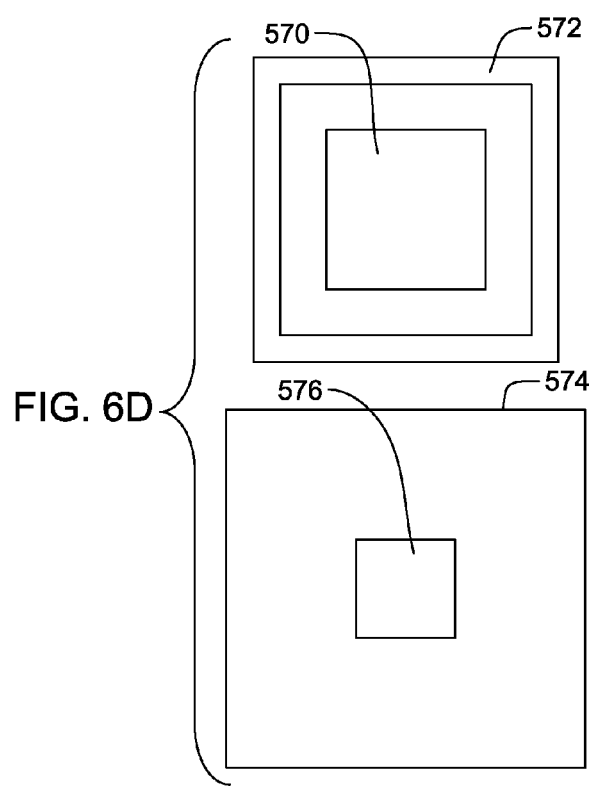

FIG. 6D presents another example of a lithographic mask pattern correlated to the resulting resist pattern formed in a dual-tone resist when exposed using the mask pattern, in accordance with aspects described herein. Specifically, the mask pattern includes a solid mask element 570 surrounded by (but spaced apart from) a mask element 572. The resulting resist element formed includes a generally square shaped feature 574 which is exposed to the intermediate intensity level, having a hole 576 where the resist is exposed to the low intensity level and therefore is removed when developed. This particular feature may be useful for, for instance, defining a hole or void to be etched in the mask layer underlying the resist.

Aspects described herein can simplify the process flow in processes for feature creation, such as processes for creation of fins in a substrate material. Not only are improvements in critical dimension and resolutions realized, but additional advantages such as lower material and manufacturing cost, and faster processing, are achieved.

Described herein are processes for forming features in a material layer, such as patterned features in a mask layer above a substrate. The mask layer may be a hardmask layer. A patterned mask may be formed in-situ from the hardmask layer sitting atop a substrate material. The formation may include performing a lithographic exposure of a dual-tone resist disposed over the mask layer. The exposure may be performed using only a single binary lithographic mask, while the exposure provides high, low, and intermediate exposure levels to different regions of the resist to define high exposure region(s), intermediate exposure region(s), and low exposure region of the resist(s). The resist may be configured to exhibit high solubility to a developer where exposed to the high exposure level, high solubility to a developer where exposed to the low exposure level, and low solubility to a developer where exposed to the intermediate exposure level. Characteristics, such as sizing and positioning, of a region of the resist exposed to the intermediate exposure level may be defined by a slope of an exposure intensity curve between the high exposure level and the low exposure level. The region exposed to the intermediate exposure level may define a pattern in the resist to facilitate forming the patterned hardmask.

Portions of the resist may then be developed and removed, in which the region(s) exposed to the intermediate exposure level remain intact. Thus, the portions removed may be the portions exposed to the high or to the low exposure levels. The development and removal of resist material may form a mask in the resist, the mask in the resist to pattern the hardmask layer underneath the resist layer to form the hardmask. A material removal process can be performed, using the hardmask, to remove portions of the substrate material and form features in the substrate material.

As an example, the features in the substrate material may be multiple lines for forming fins in the substrate material. The multiple lines may correspond to positioning and dimension of the fins formed in the substrate material.

Prior to fabricating the lithographic mask to use for the exposure above, lithographic mask data for the lithographic mask must be established. Establishing this lithographic mask data may include, in one approach, obtaining a critical dimension target for a pattern of the multiple lines, the pattern of the multiple lines being the pattern for the patterned hardmask. The, initial mask data is determined based on the obtained critical dimension target, the initial mask data indicating substantially translucent or opaque regions to form on the lithographic mask. These indicated substantially translucent or opaque regions correspond to spaces between the multiple lines to be exposed to the intermediate exposure level in performing the lithographic exposure of the resist. Finally, the initial mask data is modified to obtain modified mask data. The modifying includes resizing the indicated substantially translucent or opaque regions in the mask data based on at least one characteristic of the resist. The at least one characteristic of the resist may selected based on the critical dimension target for the resist features. For instance, a particular dual-tone resist may be chemically configured so that the threshold intensities ($I_1$ and $I_2$ above) enable achieving the target critical dimension of the multiple lines.

As an example of modifying the initial mask data, the modifying may increase a width of the indicated substantially translucent or opaque regions indicated by the initial mask data. The width may be increased by a distance equal to the critical dimension of a line of the multiple lines, for instance.

In another approach, establishing the lithographic mask data for the lithographic mask for use in the performing the lithographic exposure of the resist includes obtaining a critical dimension target for an initial pattern for the multiple lines of the resist, then modifying the initial pattern for the multiple lines to obtain a modified pattern for the multiple lines. The modifying may include resizing the multiple lines of the initial pattern based on at least one characteristic of the resist. Finally, the lithographic mask data for the lithographic mask may be generated based on the modified pattern for the multiple lines, where the generated lithographic mask data indicates substantially translucent or opaque regions to form on the lithographic mask to produce the modified pattern for the multiple lines when the resist is lithographically exposed.

As an example of modifying the initial mask data, the modifying may decrease a width of the multiple lines of the initial pattern.

Any desired features may be formed in the resist, and therefore the hardmask and ultimately the substrate material. As noted above, aspects described herein facilitate formation of not only one-dimensional features (lines), but features of other shapes and/or sizes. Accordingly, aspects described herein may facilitate formation of features that may be arrayed in first and second directions. That is, opaque regions can be arrayed in the first and second directions (perhaps perpendicular to each other) to produce an array of features transferred to a substrate material.

In some examples, the features being formed in the substrate material include vias extending at least partially through the substrate material. For instance, the region(s) of resist exposed to the intermediate exposure level may surround a first plurality of regions of resist exposed to the high exposure level and surround a second plurality of regions of resist exposed to the low exposure level. The developing and removing resist material may remove the resist in the first plurality of regions and remove the resist in the second plurality of regions. These first plurality of regions and second plurality of regions can define positioning of holes patterned in the hardmask, where the vias formed in the substrate material correspond to the holes in the hardmask, in which the material removal process (to remove substrate material using the hardmask) removes portions of the substrate material underlying the holes to form the vias in the substrate material.

Additionally described herein is the ability to tailor sizing, spacing, and arraying of opaque regions of a lithographic mask to produce dense and/or semi-dense features in a dual-tone resist. Thus, processes for establishing lithographic mask data for fabrication of a lithographic mask are provided, one example process of which is described with reference to FIG. 7. The lithographic mask may be for exposing different regions of a resist to high, low, and intermediate exposure levels. The resist may be configured to exhibit high solubility to a developer when exposed to one or more of the high exposure level or the low exposure level, and exhibit low solubility to a developer when exposed to the intermediate exposure level.

Figure 7:
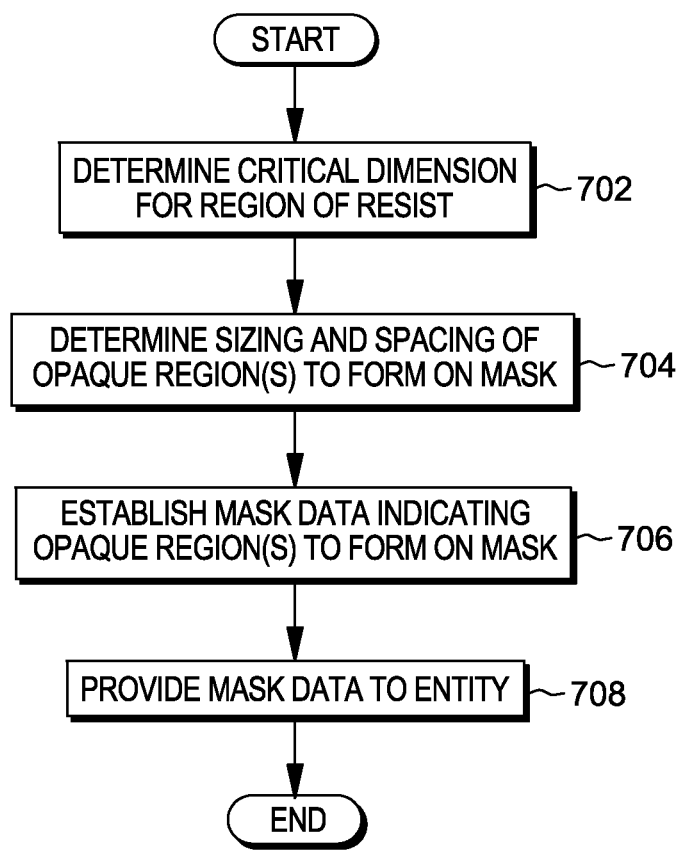
FIG. 7 depicts an example process to establish lithographic mask data for fabrication of a lithographic mask, in accordance with aspects described herein.

The process of FIG. 7 begins by determining a critical dimension for a region of the resist to be exposed to the intermediate exposure level (702). Then, sizing of opaque regions to form on the mask, and the spacing between those opaque regions, is determined (704). Lithographic mask data indicating those opaque regions is the established (706), where the opaque regions are arrayed in at least one direction and configured to block, at least partially, light from passing through the lithographic mask. Arraying the opaque regions facilitates exposing the region of the resist to an intermediate exposure level to achieve the determined critical dimension for the region of the resist. The established lithographic mask data can then be provided to an entity (708) for fabrication of the lithographic mask.

Determination of the spacing of the opaque regions includes sizing of gap(s) between the arrayed opaque regions. Sizing the gaps may include determining a decrease or increase in exposure level provided to at least some of the resist that results when adjacent opaque regions of the plurality of arrayed opaque regions are positioned closer or farther apart. The intermediate exposure level is a range of exposure levels between two threshold exposure intentisites, and the sizing of the gaps can include selecting sizing of the gaps based on a determination that changes in exposure level of the region of the resist caused by the gaps remain within that range of exposure levels.

Arraying the plurality of opaque regions may facilitate achieving a critical dimension larger than a critical dimension achievable with the resist using only a single opaque region formed on the lithographic mask. Referring back to FIG. 5A, critical dimension (width) of resist feature 528 is relatively large. It may be impossible or impractical to achieve this critical dimension with only a single opaque region. This is because, as explained above, a single opaque region that size may block too much light, allowing the exposure intensity to dip below $I_1$. In this manner, the determined critical dimension of the region to form in the resist may be a critical dimension selectably larger than a maximum critical dimension achievable with the resist using only a single opaque region formed on the lithographic mask.

Figure 8:
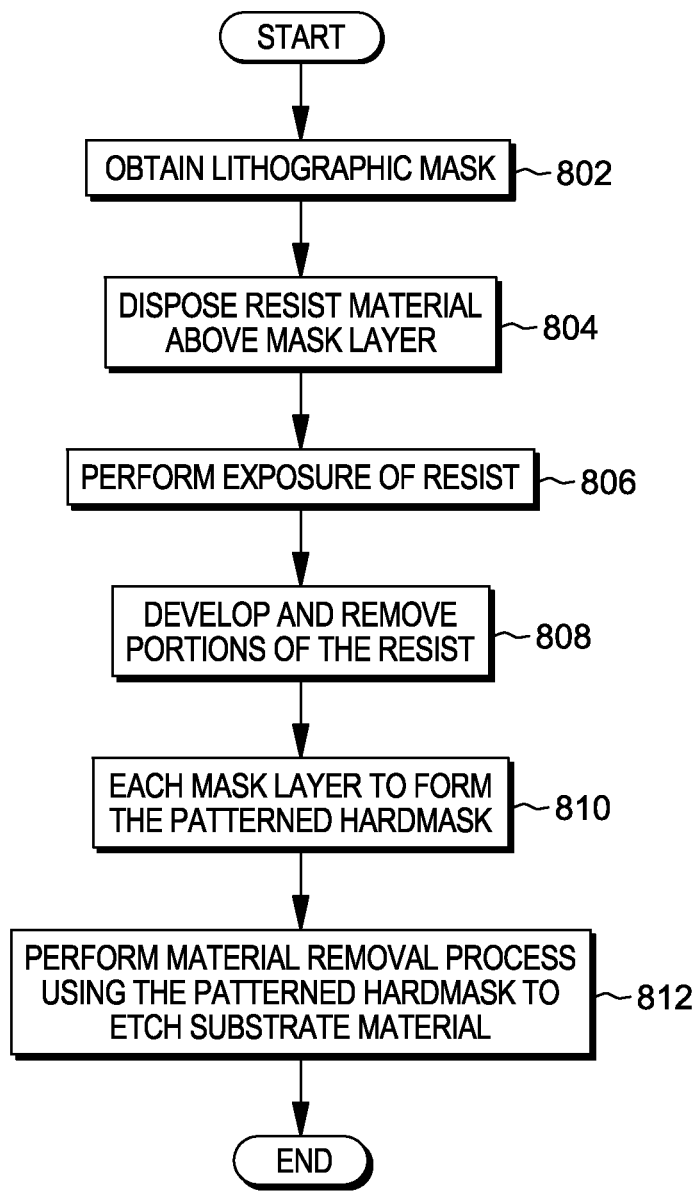
FIG. 8 depicts an example process for forming, in-situ, a patterned mask from a mask layer above a substrate material, in accordance with aspects described herein.

FIG. 8 depicts an example process for forming in-situ a patterned mask from a mask layer above a substrate material, in accordance with aspects described herein. In one example, the mask layer is a hardmask material layer in which a hardmask is to be formed.

The process begins by obtaining a lithographic mask including a plurality of opaque regions arrayed in at least one direction (802). A resist material is disposed above the mask layer (804), where the resist material is configured to exhibit high solubility to a developer when exposed to at least one of a high exposure level or a low exposure level, and exhibit low solubility to a developer when exposed to an intermediate exposure level.

An exposure of the resist is performed (806) using the obtained lithographic mask, where the arrayed plurality of opaque regions are configured to block, at least partially, light from passing through the lithographic mask, and where the plurality of opaque regions being arrayed facilitates exposing a region of the resist to an intermediate exposure level to achieve a determined critical dimension for the region of the resist, the region corresponding to critical dimension of an element of the patterned mask. In some examples, performing the exposure of the resist exposes a plurality of regions of the resist to the intermediate exposure level.

The resist may then be developed and portions thereof removed (808), where the plurality of regions exposed to the intermediate exposure level remain intact. In some examples, the resist is left with a pattern of features. A subsequent etch of the mask layer is then performed (810) to form the patterned mask, where the intact plurality of regions exposed to the intermediate exposure level form the pattern of the patterned mask. Once the patterned mask is formed, a material removal process may be performed using the patterned mask (812), to remove portions of the substrate material and form a plurality of features in the substrate material.

In a particular example, the plurality of regions exposed to the intermediate exposure level pattern a plurality of substantially parallel lines in the patterned mask, and the plurality of features formed in the substrate material include a plurality of substantially parallel fins formed in the substrate material, in which the plurality of substantially parallel fins are formed using the plurality of substantially parallel lines in the patterned mask.

As above, the determined critical dimension may be larger than a maximum critical dimension achievable with the resist using only a single opaque region formed on the lithographic mask on which the plurality of opaque regions are arrayed. This facilitates achieving a critical dimension larger than the maximum critical dimension achievable with the resist using only a single opaque region formed on the lithographic mask. Specifically, gaps between the arrayed opaque regions may be sized to maintain exposure level of the region of the resist within the range of exposure levels.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

The invention claimed is:
1. A method comprising:
  establishing lithographic mask data for fabrication of a lithographic mask for exposing different regions of a resist to high, low, and intermediate exposure levels, the resist configured to exhibit high solubility to a developer when exposed to one or more of the high exposure level or the low exposure level, and exhibit low solubility to a developer when exposed to the intermediate exposure level, the establishing comprising:
  determining a critical dimension for a region of the resist to be exposed to the intermediate exposure level; and
  establishing lithographic mask data indicating a plurality of opaque regions for forming on the lithographic mask, the plurality of opaque regions being arrayed in at least one direction and configured to block, at least partially, light from passing through the lithographic mask, wherein the plurality of opaque regions being arrayed facilitates exposing the region of the resist to an intermediate exposure level to achieve the determined critical dimension for the region of the resist.

2. The method of claim 1, wherein the determined critical dimension is larger than a critical dimension achievable with the resist using only a single opaque region formed on the lithographic mask.

3. The method of claim 1, wherein the plurality of opaque regions being arrayed facilitates achieving a critical dimension larger than a critical dimension achievable with the resist using only a single opaque region formed on the lithographic mask.

4. The method of claim 1, wherein the method further comprises sizing one or more gaps between the plurality of opaque regions.

5. The method of claim 4, wherein the sizing comprises determining a decrease or increase in exposure level of at least some of the resist that results when adjacent opaque regions of the plurality of arrayed opaque regions are positioned closer or farther apart.

6. The method of claim 5, wherein the intermediate exposure level is a range of exposure levels, and wherein the sizing further comprises selecting sizing of the one or more gaps based on a determination that changes in exposure level of the region of the resist caused by the gaps remain within the range of exposure levels.

7. The method of claim 1, providing the established lithographic mask data to an entity for fabrication of the lithographic mask.

8. The method of claim 1, wherein the determined critical dimension is any critical dimension selectably larger than a maximum critical dimension achievable with the resist using only a single opaque region formed on the lithographic mask.

9. A method comprising:
  forming in-situ a patterned mask from a mask layer above a substrate material, the forming comprising:
    obtaining a lithographic mask comprising a plurality of opaque regions arrayed in at least one direction;
    disposing a resist material above the mask layer, the resist material configured to exhibit high solubility to a developer when exposed to at least one of a high exposure level or a low exposure level, and exhibit low solubility to a developer when exposed to an intermediate exposure level; and
    performing an exposure of the resist using the obtained lithographic mask, wherein the arrayed plurality of opaque regions are configured to block, at least partially, light from passing through the lithographic mask, and wherein the plurality of opaque regions being arrayed facilitates exposing a region of the resist to an intermediate exposure level to achieve a determined critical dimension for the region of the resist, the region corresponding to critical dimension of an element of the patterned mask.

10. The method of claim 9, wherein performing the exposure of the resist exposes a plurality of regions of the resist to the intermediate exposure level, and wherein the method further comprises:
  developing and removing portions of the resist, wherein the plurality of regions exposed to the intermediate exposure level remain intact; and
  etching the mask layer to form the mask, wherein the intact plurality of regions exposed to the intermediate exposure level pattern the patterned mask.

11. The method of claim 10, further comprising performing a material removal process, using the patterned mask, to remove portions of the substrate material and form a plurality of features in the substrate material.

12. The method of claim 11, wherein the plurality of regions exposed to the intermediate exposure level pattern a plurality of substantially parallel lines in the patterned mask, and wherein the plurality of features comprise a plurality of substantially parallel fins formed in the substrate material, the plurality of substantially parallel fins formed using the plurality of substantially parallel lines in the patterned mask.

13. The method of claim 9, wherein the patterned mask comprises a hardmask.

14. The method of claim 9, wherein the determined critical dimension is larger than a critical dimension achievable with the resist using only a single opaque region formed on the lithographic mask.

15. The method of claim 9, wherein the plurality of opaque regions being arrayed facilitates achieving a critical dimension larger than a critical dimension achievable with the resist using only a single opaque region formed on the lithographic mask.

16. The method of claim 9, wherein one or more gaps exist between the plurality of opaque regions, wherein the intermediate exposure level is a range of exposure levels, and wherein the one or more gaps are sized to maintain exposure level of the region of the resist within the range of exposure levels.

* * * * *